(12) United States Patent
Wainscott

(10) Patent No.: US 8,798,973 B2
(45) Date of Patent: Aug. 5, 2014

(54) METHOD OF SIMULATING IMPACT EVENTS IN A MULTI-PROCESSOR COMPUTER SYSTEM

(75) Inventor: Brian Wainscott, San Ramon, CA (US)

(73) Assignee: Livermore Software Technology Corp., Livermore, CA (US)

( * ) Notice: Subject to any disclaimer, the term of this patent is extended or adjusted under 35 U.S.C. 154(b) by 685 days.

(21) Appl. No.: 12/343,478

(22) Filed: Dec. 24, 2008

(65) Prior Publication Data

US 2010/0161296 A1      Jun. 24, 2010

(51) Int. Cl.
*G06G 7/48* (2006.01)
*G06F 17/50* (2006.01)

(52) U.S. Cl.
CPC .................... *G06F 17/5018* (2013.01)
USPC ........................................................... 703/6

(58) Field of Classification Search
None
See application file for complete search history.

(56) References Cited

PUBLICATIONS

Kondo, et al. "Crash Simulation of Large-Number-of-Elements Car Model by LS-DYNA on Highly Parallel Computers", Fujitsu Sci. Tech. J., Oct. 2008, vol. 44, No. 4, pp. 467-474.*

Lin et al. "A Performance Study of LS-DYNA on Vehicle Crash Simulation", 2000, pp. 17-17-17-24.*
Marzougui et al. "Development and Validation of an NCAP Simulation Using LS-DYNA3D", 1997, 13 pages.*
Lonsdale et al. "Dynamic Re-Allocation of Meshes for parallel Finite Element Applications", 4th ECCOMAS Computational FLuid Dynamics Conference, Sep. 7, 1998, 11 pages.*
Qi, et al. "Finite element simulation and performance study of vehicle crash based on parallel computing", Journal of System Simulation, vol. 16, No. 11 pp. 2428-2431 Nov. 2004.

* cited by examiner

*Primary Examiner* — Suzanne Lo
(74) *Attorney, Agent, or Firm* — Roger H. Chu

(57) ABSTRACT

A computer-implemented method of simulating an impact event in a finite element analysis used for assisting users to design or improve one or more structures is described. The structures are represented in a finite element analysis model that is divided or partitioned into a plurality of domains. Efficiency of the method is achieved when used in a computer system having multiple processing units and multiple contact interfaces defined and specified by users (engineers and/or scientists). Each domain is associated with or assigned to one of the processing units. A "group-able" correlation is established or determined between domains and contact interfaces so that data communications can be conducted in most efficient manner, for example, minimizing idle processing units during data communications.

13 Claims, 8 Drawing Sheets

METHOD OF SIMULATING IMPACT EVENTS IN A MULTI-PROCESSOR COMPUTER SYSTEM

FIELD OF THE INVENTION

The present invention generally relates to computer-aided engineering analysis of a structure (e.g., car, airplane), more particularly to improved method of simulating impact events in a multi-processor computer system with higher efficiency.

BACKGROUND OF THE INVENTION

Finite element analysis (FEA) is one of the most popular computer aided engineering tool for engineers and scientists to model and solve engineering problems relating to complex systems such as three-dimensional non-linear structural design and analysis. FEA derives its name from the manner in which the geometry of the object under consideration is specified. With the advent of the modern digital computer, FEA has been implemented as FEA software. Basically, the FEA software is provided with a model of the geometric description and the associated material properties at each point within the model. In this model, the geometry of the system under analysis is represented by solids, shells and beams of various sizes, which are called elements. The vertices of the elements are referred to as nodes. The model is comprised of a finite number of elements, which are assigned a material name to associate with material properties. The model thus represents the physical space occupied by the object under analysis along with its immediate surroundings. The FEA software then refers to a table in which the properties (e.g., stress-strain constitutive equation, Young's modulus, Poisson's ratio, thermo-conductivity) of each material type are tabulated. Additionally, the conditions at the boundary of the object (i.e., loadings, physical constraints, etc.) are specified. In this fashion a model of the object and its environment is created.

FEA has been used by automobile manufacturers for optimizing both the aerodynamic performance and structural integrity of vehicles. One of the popular FEA tasks is to simulate impact events such as car crash, metal forming, bird impact, etc. Many of the prototype testing can be replaced by the computer simulations, which are preferably performed in a reasonable time frame (e.g., overnight) so that users (i.e., engineers and/or scientists) can be productive. To ensure the productivity, most of the FEA models are limited by computer's power (i.e., processing speed, memory capacity, etc.) when the FEA first used for simulating impact events. In theory, this problem should be solved when computers improve over time. However, as computing power has been increased for the past decades, the FEA model of an automobile has been increased accordingly, for example, a common FEA model of an automobile can contain more than 1,000,000 elements. Using such large size FEA model, simulating an impact event using the finite element analysis still takes very long time. To solve this problem, modern finite element analysis software is capable of executing on a multi-processor computer. As a result, many area of finite element analysis have been improved on the parallel processing. However, there is a new problem emerged when users define and specify large numbers of contact interface for an impact event. Prior art approaches of handling contact interfaces cause the multi-processor computer system to lose parallel efficiency, which results into either loss of productivity (long simulation time) or loss of accuracy (smaller FEA model).

Therefore, it would be desirable to have an improved method for simulating an impact event with large numbers of contact interface in a finite element analysis to be executed in a computer system having multiple processing units.

BRIEF SUMMARY OF THE INVENTION

This section is for the purpose of summarizing some aspects of the present invention and to briefly introduce some preferred embodiments. Simplifications or omissions in this section as well as the abstract and the title herein may be made to avoid obscuring the purpose of the section. Such simplifications or omissions are not intended to limit the scope of the present invention.

The present invention discloses a system, method and software product for simulating an impact event in a finite element analysis used for assisting users to design or improve one or more structures.

According to one embodiment, the present invention is a computer-implemented method of simulating an impact event in a finite element analysis used for assisting users to design or improve one or more structures, the method comprises at least the followings: receiving a finite element analysis model of one or more structures subject to an impact event in a computer system with a plurality of processing units coupled thereon, wherein the finite element analysis model contains a plurality of contact interfaces; dividing a finite element analysis model into a plurality of domains containing at least a first domain and a second domain in the computer system, the first domain is associated with a first processing unit while the second domain is associated with a second processing unit of the processing units; determining, in the computer system, a group-able correlation between each of the contact interfaces, and one or more of the domains; performing, in the computer system, a time-marching simulation of the impact event having a plurality of solution cycles; at each of the solution cycles, creating and sending a first data communication message from the first processing unit to the second processing unit in accordance with the group-able correlation such that maximum possible data communications relevant to the contact interfaces are exchanged; performing a plurality of computations for the respective contact interfaces of the finite element analysis at each of the first and second processing units with data received in the first data communication message; creating and sending a second data communication message in a reverse direction of the first data communication message, the second message is configured to transmit data resulted from the computations; and displaying results of the simulation in a monitor coupling to the computer system after all of the solution cycles have been computed.

Other objects, features, and advantages of the present invention will become apparent upon examining the following detailed description of an embodiment thereof, taken in conjunction with the attached drawings.

BRIEF DESCRIPTION OF THE DRAWINGS

These and other features, aspects, and advantages of the present invention will be better understood with regard to the following description, appended claims, and accompanying drawings as follows:

DETAILED DESCRIPTION

Figure 1:
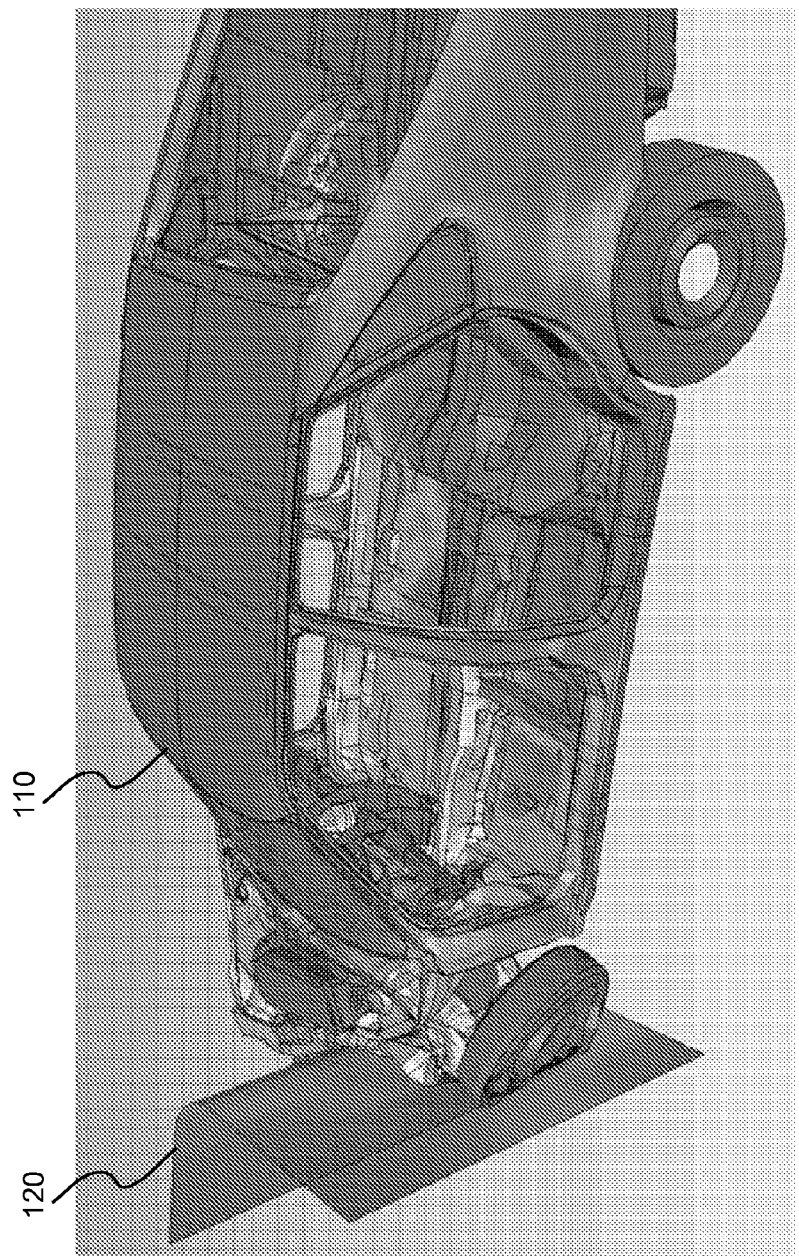
FIG. 1 is a diagram showing an exemplary finite element analysis result (i.e., a car crash simulation result), which can be performed in a computer system, according to one embodiment of the present invention.
Figure 2:
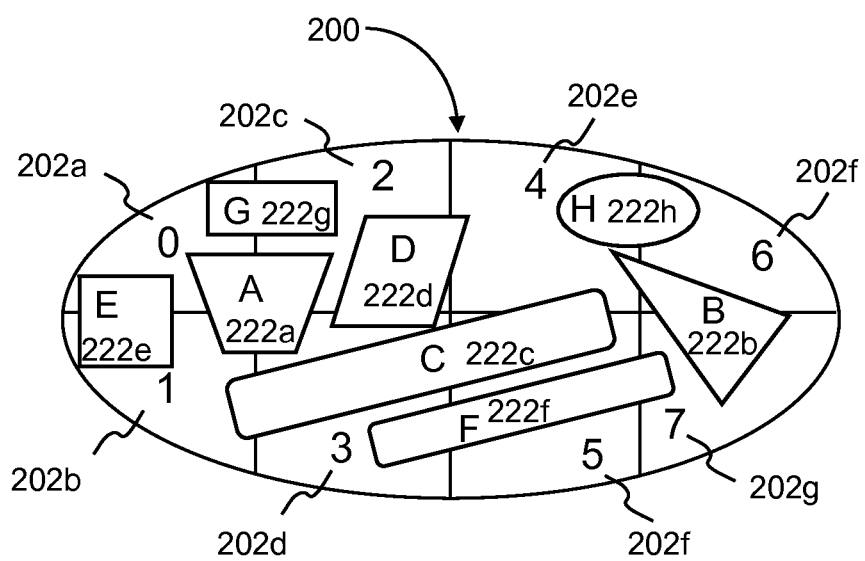
FIG. 2 is a diagram showing an exemplary structure having a number of contact interfaces partitioned into a number of domains in accordance with one embodiment of the present invention.

In the following description, numerous specific details are set forth in order to provide a thorough understanding of the present invention. However, it will become obvious to those skilled in the art that the present invention may be practiced without these specific details. The descriptions and representations herein are the common means used by those experienced or skilled in the art to most effectively convey the substance of their work to others skilled in the art. In other instances, well-known methods, procedures, components, and circuitry have not been described in detail to avoid unnecessarily obscuring aspects of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

To facilitate the description of the present invention, it deems necessary to provide definitions for some terms that will be used throughout the disclosure herein. It should be noted that the definitions following are to facilitate the understanding and describe the present invention according to an embodiment. The definitions may appear to include some limitations with respect to the embodiment, the actual meaning of the terms has applicability well beyond such embodiment, which can be appreciated by those skilled in the art:

FEA stands for Finite Element Analysis.

Implicit FEA or solution refers to K u=F, where "K" is the effective stiffness matrix, "u" is the unknown displacement array and "F" is the effective loads array. "F" is a right hand side loads array while "K" is a left hand side stiffness matrix. The solution is performed at the global level with a factorization of the effective stiffness matrix, which is a function of the stiffness, mass and damping. One exemplary solution method is the Newmark time integration scheme.

Explicit FEA refers to M a=F, where "M" is the diagonal mass array, "a" is the unknown nodal acceleration array and "F" is the effective loads array. The solution can be carried out at element level without factorization of a matrix. One exemplary solution method is called the central difference method.

Time-marching simulation or time-domain analysis refers to an engineering analysis simulation in time domain, for example, a simulation of car crashworthiness using a finite element analysis in time domain.

Embodiments of the present invention are discussed herein with reference to FIGS. 1-8. However, those skilled in the art will readily appreciate that the detailed description given herein with respect to these figures is for explanatory purposes as the invention extends beyond these limited embodiments.

Referring first to FIG. 1, which is a diagram showing an exemplary finite element analysis result of a car crash simulation (i.e., an impact event). In other words, a graphical display of numerical results from a finite element analysis of simulating an impact event. There are two structures included in the simulation: an automobile 110 and a barrier 120. Both of the structures are represented in a finite element analysis model. The simulation can be done as a time-marching simulation of the impact event numerically in a computer system (e.g., computer 700 or computer system 800). The automobile can have more than 1,000,000 finite elements (e.g., shell, solid and beam elements). For computations of contact between two structures, a number of contact interfaces are defined and specified by the user. The contact interface is configured for properly simulating contacts between two or more structures and sometimes for a structure itself.

To execute the finite element analysis on a multi-processor computer system, the finite element analysis model is partitioned or divided into a number of domains based on a technique called domain decomposition. The objective is to assign or associate one domain to a particular one of the processing units of the computer system such that the computation load or effect to each of the domains will be roughly equal. Exemplary domains of a structure 200 are demonstrated in FIG. 2. The structure 200 is shown as an ellipse for illustration simplicity. There are eight domains 202a -h denoted as "domain 0" 202a, "domain 1" 202b, . . . , "domain 8" 202h partitioned from the structure 200. And there are eight contact interfaces 222a-h shown as "contact interface A" 222a, "contact interface B" 222b, . . . , "contact interface H" 222h. The domains are generally created by the finite element application module that is capable of performing domain decomposition scheme. To perform parallel finite element computation, each domain is assigned to and handled by one of the processors or processing units of a multi-processor computer system. Each processing unit is responsible of computations of the assigned or associated domain. Relevant data along boundaries of domains are exchanged among respective processing units. For example, data for a contact interface must be shared amongst relevant processing units. In order to take advantage of the present invention, each finite element model contains multiple contact interfaces, which are defined and specified by users. It is noted, in real world, the structure is typical a three-dimensional object (e.g., a car) not the simplified two-dimensional ellipse in FIG. 2.

Figure 3:
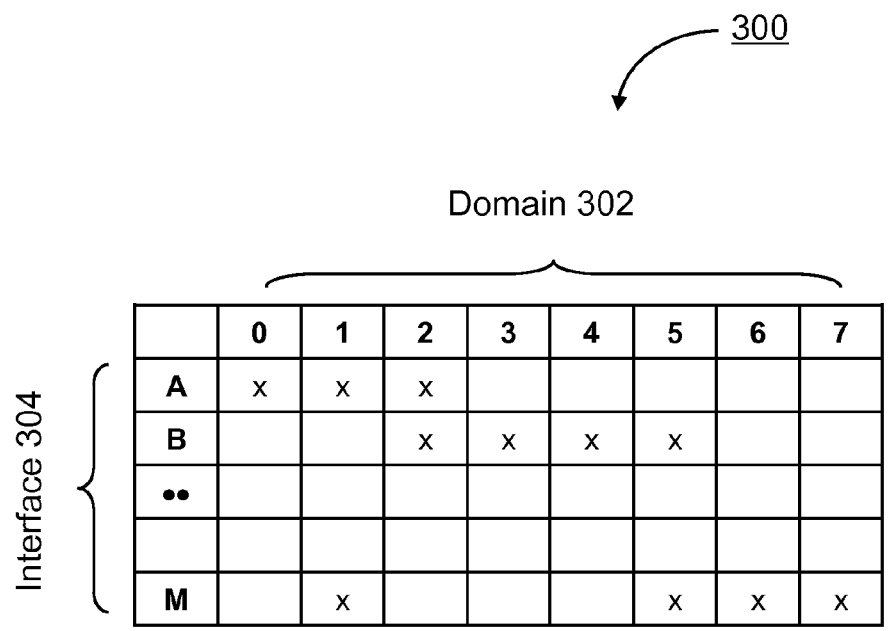
FIG. 3 is a table showing an exemplary group-able correlation between the contact interfaces and the domains in accordance with one embodiment of the present invention.

Based on the physical locations of the domains and the contact interfaces, a "group-able" correlation can be determined. For example, FIG. 3 is a table 300 showing an exemplary group-able correlation between domains 302 and contact interfaces 304. For example, "interface A" spans over three domains: "domain 0", "domain 1" and "domain 2" denoted by "X", "interface B" covers "domain 2", "domain 3", "domain 4" and "domain 5", etc. Since each of the domains 302 is associated with or assigned to one of the processing units, finite element analysis computations of each of the domains 302 are computed by respective processing unit. If entire contact interface is located within a domain, then the computations can be performed with the respective processing unit without any data communications with other processing units. However, as evidently shown in FIG. 3, when the contact interfaces 304 span more than one domain, the computations of structural contact in the finite element analysis need to be performed with certain data from other processing units (or domains). For example, structural contact for "contact interface A" is computed in processing units assigned to handle "domain 0", "domain 1" and "domain 2". As a result, data communications among these processing units are required before and after the computations. Similarly, "contact interface M" needs to include data communications among "domain 1", "domain 5", "domain 6" and "domain 7" to ensure proper contact computations.

Figure 4:
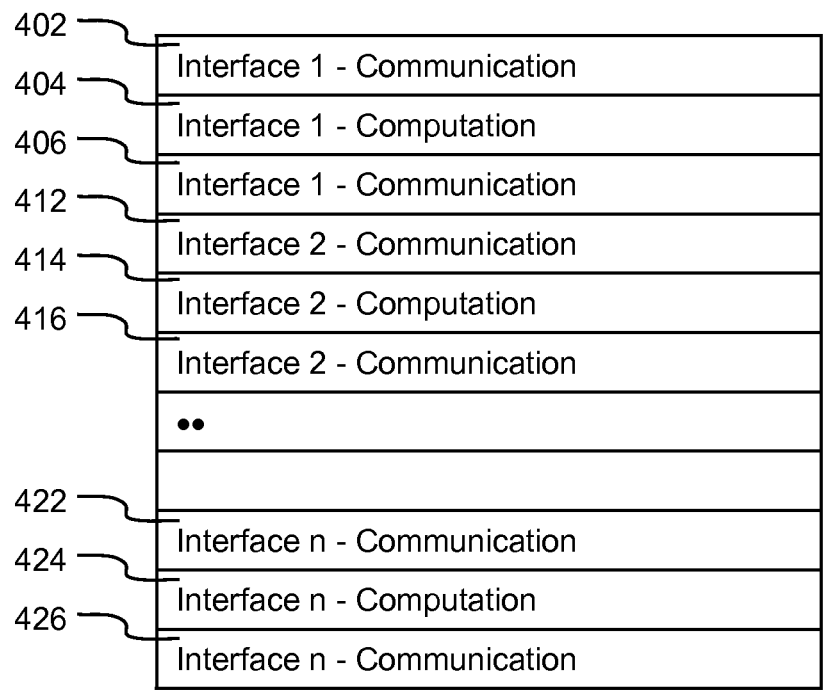
FIG. 4 is a table showing a sequence of data communications and computations for multiple contact interfaces in a finite element analysis according to a prior art approach.

FIG. 4 is a table showing a sequence computations according to an prior art approach. The sequence starts with "contact interface 1"—communication 402, computation 404 followed by another communication 406. Then "contact interface 2"—communication 412, computation 414 and another communication 416. The sequence goes on until the last interface, "contact interface n", with communication 422, computation 424 and communication 426. The prior art approach is inefficient and sequential. As a result, some of the processing units are idle when any one of the contact interfaces is processed. When users define and specify large numbers of contact interface (e.g., 50 more), the prior art approach becomes very inefficient due to so many contact interfaces.

Figure 5:
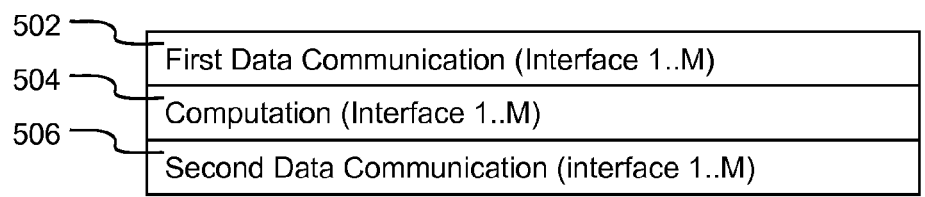
FIG. 5 is a table showing an exemplary sequence of data communications and computations for multiple contact interfaces in accordance with an embodiment of the present invention.

FIG. 5 is a table showing an exemplary sequence of data communications and computations for multiple contact interfaces in accordance with an embodiment of the present invention. First data communication 502 for all of the contact interfaces (e.g., "interfaces A", . . . "interface M" of FIG. 3) is grouped together as one message before transmitting to other processing units. This can ensure maximum possible data communications to be exchanged in a most efficient manner in parallel. To set up the first data communication 502, the "group-able" correlation (e.g., table 300 in FIG. 3) needs to be identified, established or determined. Only those contact interfaces allowed to be processed in parallel are deemed to be "group-able". When computations of a particular contact interface depend upon another contact interface, the particular contact interface cannot be included in the "group-able" correlation.

After the first data communication 502 has been completed, computations 504 of structural contact can be performed in respective processing unit. After the computations 504, a second data communication 506 is created and sent in a reverse direction of the first data communication 502 to complete each solution step (e.g., an iteration of a finite element analysis, a solution cycle of a time-marching simulation, etc.).

To demonstrate the efficiency, according to one embodiment of the present invention, an exemplary finite element analysis model comprising 1,151,856 nodes and 1,116,160 shell elements and 75 contact interfaces is used. Computer systems with 8-, 16-, 32-, 64-and 128-processing units are used for the comparison study. The computation results are summarized below to show the improvement from prior approach.

TABLE 1

Elapsed Time (Seconds)

| | 8-proc | 16-proc | 32-proc | 64-proc | 128-proc |
|---|---|---|---|---|---|
| Prior art | 7198 | 4143 | 2292 | 1480 | 1092 |
| Invention | 7099 | 3559 | 1805 | 995 | 696 |

TABLE 2

Contact Time (Seconds)

| | 8-proc | 16-proc | 32-proc | 64-proc | 128-proc |
|---|---|---|---|---|---|
| Prior art | 5941 | 3431 | 1939 | 1247 | 898 |
| Invention | 5863 | 2916 | 1494 | 813 | 546 |

TABLE 3

Speedup (Present Invention)

| | 8-proc | 16-proc | 32-proc | 64-proc | 128-proc |
|---|---|---|---|---|---|
| Elapsed | 1 | 1.99 | 3.93 | 7.13 | 10.2 |
| Contact | 1 | 2.01 | 3.92 | 7.21 | 10.73 |

Table 1 shows a comparison between the prior art approach and the present invention in elapsed time in seconds, while Table 2 shows contact time in seconds. The elapsed time is the computation time of entire simulation and the contact time is the computation time spent in the contact computations only. Table 3 shows a summary of speedup using the 8-processing unit run as a basis (i.e., speedup of 1.0) using the approach in accordance with one embodiment of the present invention. The speedup summary includes both elapsed time and contact time.

Figure 6:
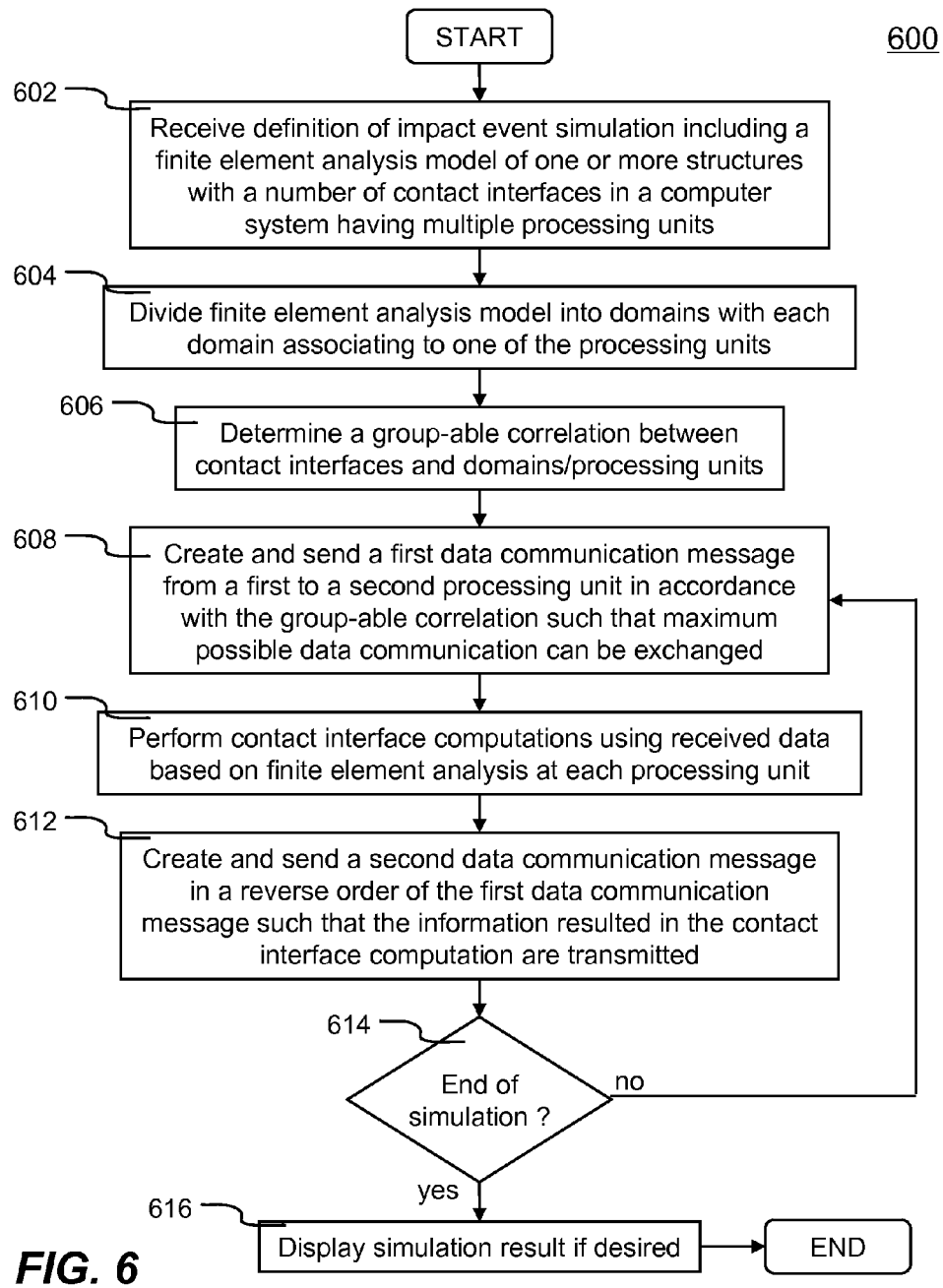
FIG. 6 is a flowchart illustrating an exemplary process of simulating an impact event in a finite element analysis used for assisting users to design or improve one or more structures, according to an embodiment of the present invention.

Referring now of FIG. 6, which is a flowchart illustrating an exemplary process 600 of simulating an impact event in a finite element analysis used for assisting users to design or improve one or more structures, according to one embodiment of the present invention. Process 600 is implemented in software and preferably understood with previous figures.

Process 600 starts by receiving a definition of an impact event simulation (e.g., car crash, metal forming) in a computer system at step 602. The computer system is configured with multiple processing units preferably more than two. The definition includes a finite element analysis model containing one or more structures with a number of contact interfaces. The contact interfaces are defined and specified by users (e.g., engineers and/or scientists) of the finite element analysis or simulation.

Next, at step 604, the finite element analysis model is divided or partitioned into a number of domains based on a domain decomposition scheme. Each domain is associated with or assigned to one of the processing units. Then a "group-able" correlation between domains and contact interfaces is established or determined at step 606. Once the "group-able" correlation is determined, each solution cycle of the time-marching simulation of the impact event can be performed with the following steps. At step 608, a first data communication message is created and sent from a first to a second processing unit in accordance with the "group-able" correlation such that maximum possible data communication can be exchanged in a most efficient manner. One example of most efficient manner is to minimize idle processing unit when performing data communications. Then at step 610, computations of structural contact (at each contact interface) of the finite element analysis can be performed at respective processing unit using the data received at step 608 and the locally stored data. Finally, at step 612, a second data communication message is created and sent in a reverse order of the first data communication message such that the inform resulted from the computations of step 610 are transmitted back to the first processing unit.

After each solution cycle, process 600 moves to test 614, in which it is determined whether the simulation has ended. If 'no', process 600 moves back to step 608 to continue perform simulation at another solution cycle. Otherwise, process 600 moves to step 616, in which the simulation results are displayed to a monitor coupling to the computer system if desired. The results can be in graphical and/or text form for users to make decision to improve or design the structures. Finally, process 600 ends.

Figure 7:
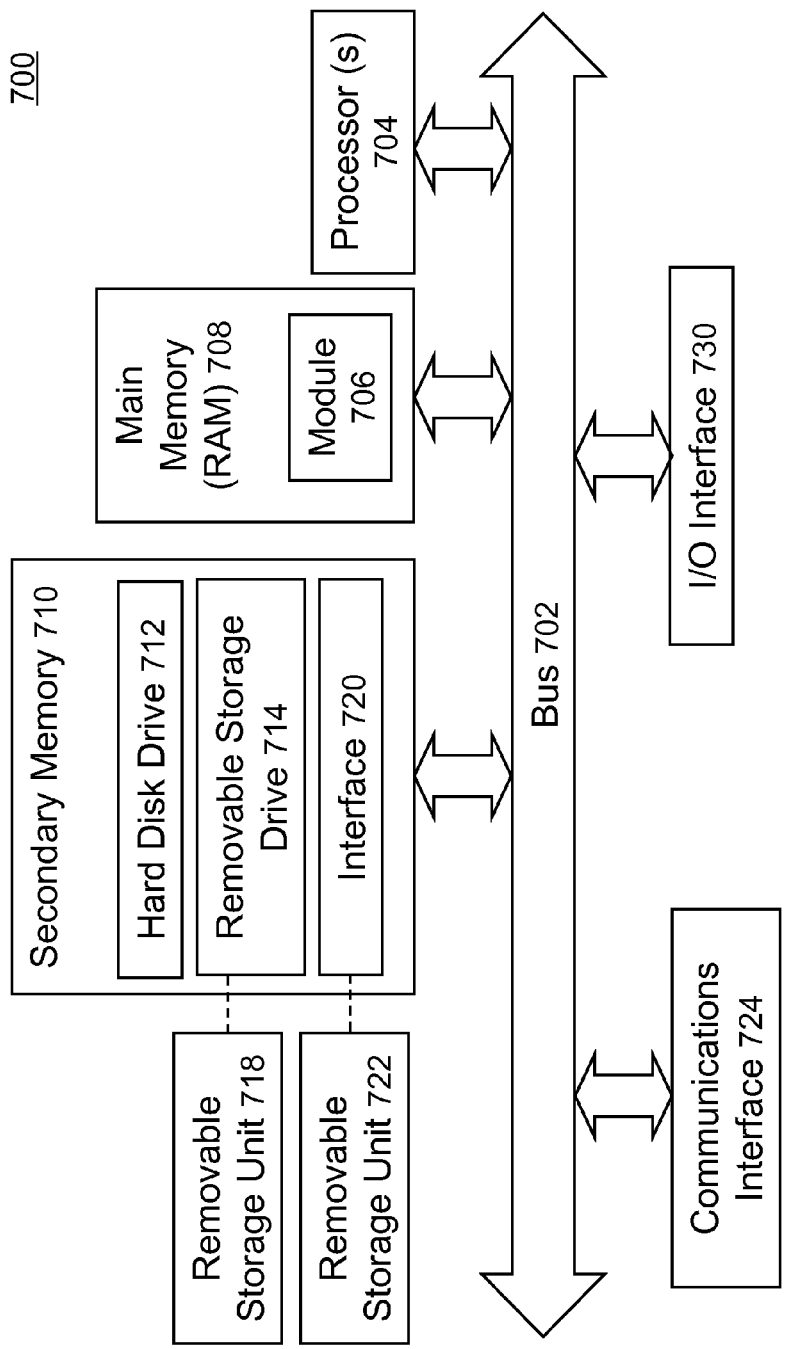
FIG. 7 is a function diagram showing salient components of an exemplary computer system, in which an embodiment of the present invention may be implemented.

According to one aspect, the present invention is directed towards one or more computer systems capable of carrying out the functionality described herein. An example of a computer system 700 is shown in FIG. 7. The computer system 700 includes one or more processors, such as processor 704. The processor 704 is connected to a computer system internal communication bus 702. Various software embodiments are described in terms of this exemplary computer system. After reading this description, it will become apparent to a person skilled in the relevant art(s) how to implement the invention using other computer systems and/or computer architectures.

Computer system 700 also includes a main memory 708, preferably random access memory (RAM), and may also include a secondary memory 710. The secondary memory 710 may include, for example, one or more hard disk drives 712 and/or one or more removable storage drives 714, representing a floppy disk drive, a magnetic tape drive, an optical disk drive, etc. The removable storage drive 714 reads from and/or writes to a removable storage unit 718 in a well-known manner. Removable storage unit 718, represents a floppy disk, magnetic tape, optical disk, etc. which is read by and written to by removable storage drive 714. As will be appreciated, the removable storage unit 718 includes a computer usable storage medium having stored therein computer software and/or data.

In alternative embodiments, secondary memory 710 may include other similar means for allowing computer programs or other instructions to be loaded into computer system 700. Such means may include, for example, a removable storage unit 722 and an interface 720. Examples of such may include a program cartridge and cartridge interface (such as that found in video game devices), a removable memory chip (such as an Erasable Programmable Read-Only Memory (EPROM), Universal Serial Bus (USB) flash memory, or PROM) and associated socket, and other removable storage units 722 and interfaces 720 which allow software and data to be transferred from the removable storage unit 722 to computer system 700. In general, Computer system 700 is controlled and coordinated by operating system (OS) software, which performs tasks such as process scheduling, memory management, networking and I/O services.

There may also be a communications interface 724 connecting to the bus 702. Communications interface 724 allows software and data to be transferred between computer system 700 and external devices. Examples of communications interface 724 may include a modem, a network interface (such as an Ethernet card), a communications port, a Personal Computer Memory Card International Association (PCMCIA) slot and card, etc. The computer 700 communicates with other computing devices over a data network based on a special set of rules (i.e., a protocol). One of the common protocols is TCP/IP (Transmission Control Protocol/Internet Protocol) commonly used in the Internet. In general, the communication interface 724 manages the assembling of a data file into smaller packets that are transmitted over the data network or reassembles received packets into the original data file. In addition, the communication interface 724 handles the address part of each packet so that it gets to the right destination or intercepts packets destined for the computer 700. In this document, the terms "computer program medium" and "computer usable medium" are used to generally refer to media such as removable storage drive 714, and/or a hard disk installed in hard disk drive 712. These computer program products are means for providing software to computer system 700. The invention is directed to such computer program products.

The computer system 700 may also include an input/output (I/O) interface 730, which provides the computer system 700 to access monitor, keyboard, mouse, printer, scanner, plotter, and alike.

Computer programs (also called computer control logic) are stored as application modules 706 in main memory 708 and/or secondary memory 710. Computer programs may also be received via communications interface 724. Such computer programs, when executed, enable the computer system 700 to perform the features of the present invention as discussed herein. In particular, the computer programs, when executed, enable the processor 704 to perform features of the present invention. Accordingly, such computer programs represent controllers of the computer system 700.

In an embodiment where the invention is implemented using software, the software may be stored in a computer program product and loaded into computer system 700 using removable storage drive 714, hard drive 712, or communications interface 724. The application module 706, when executed by the processor 704, causes the processor 704 to perform the functions of the invention as described herein.

The main memory 708 may be loaded with one or more application modules 706 that can be executed by one or more processors 704 with or without a user input through the I/O interface 730 to achieve desired tasks. In operation, when at least one processor 704 executes one of the application modules 706, the results are computed and stored in the secondary memory 710 (i.e., hard disk drive 712). The status of the finite element analysis (e.g., car crashworthiness) is reported to the user via the I/O interface 730 either in a text or in a graphical representation to a monitor coupling to the computer system 700.

Figure 8:
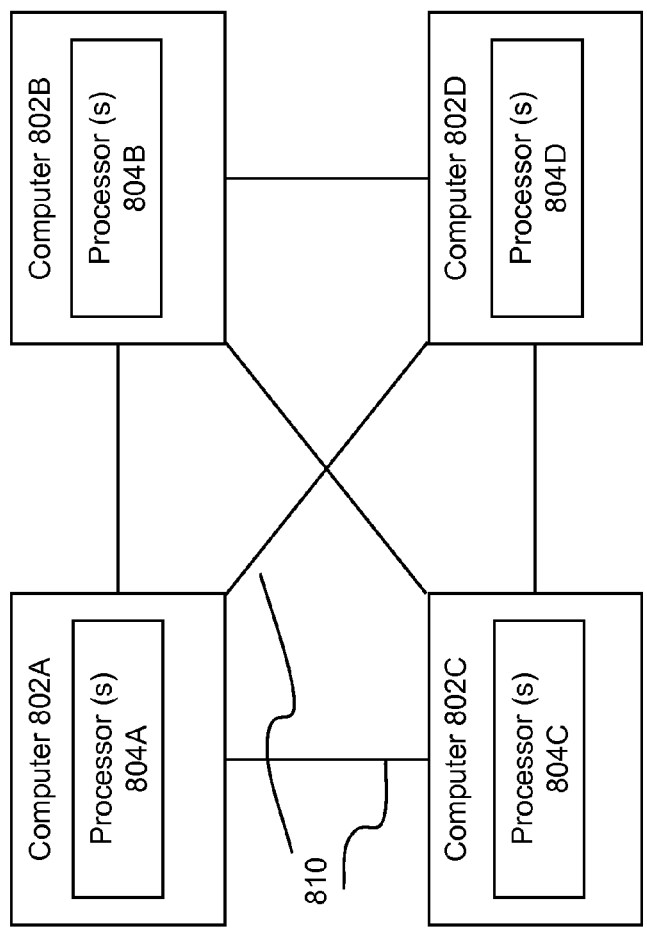
FIG. 8 is a diagram showing another exemplary computer system that can be used in accordance with one embodiment of the present invention.

Referring now to FIG. 8, which is a diagram showing an exemplary computer system 800 comprising four computers 802A-D. Each of the computers 802A-D includes at least one processor 804A-D. The processor 804A-D can be a single-, dual- or quad-core microprocessor, according to one embodiment. The computers 802A-D are connected to each other by a data network 810. The data network 810 can be a tightly-coupled network or loosely-coupled network. In one embodiment, the network 810 is the Internet. In another embodiment, the network 810 is a private network. In yet another embodiment, the network 810 is a dedicated network for the computers 802A-D exclusively.

According to one aspect of the present invention, the computer system 700 or 800 is configured to have multiple processing units. Each of the processing units may be an individual central processor 804A-D, or one of the cores in a multiple-core microprocessor. Each of the processing units is configured to handle one of the domains partitioned in a domain decomposition scheme shown in FIG. 2.

Although the present invention has been described with reference to specific embodiments thereof, these embodiments are merely illustrative, and not restrictive of, the present invention. Various modifications or changes to the specifically disclosed exemplary embodiments will be suggested to persons skilled in the art. For example, whereas eight domains and eight contact interfaces have been described and shown in FIG. 2, other numbers of domains and interfaces may be used in the present invention. Furthermore, whereas four coupled computers are shown in FIG. 8, other numbers of computers may be used, for example, eight computers each with one processor, one computer with 256 processors, or four computers each equipped with one dual-core processor, and so on. In summary, the scope of the invention should not be restricted to the specific exemplary embodiments disclosed herein, and all modifications that are readily suggested to those of ordinary skill in the art should be included within the spirit and purview of this application and scope of the appended claims.

What is claimed is:

1. A computer-implemented method of simulating an impact event in a finite element analysis used for assisting users to design or improve one or more structures, the method comprising:
   receiving a finite element analysis model of one or more structures subject to an impact event in a computer system with a plurality of processing units coupled thereon, wherein the finite element analysis model contains a plurality of contact interfaces;
   dividing a finite element analysis model into a plurality of domains containing at least a first domain and a second domain in the computer system, the first domain is associated with a first processing unit while the second domain is associated with a second processing unit of the processing units;
   determining, in the computer system, a group-able correlation table that correlates each of the contact interfaces, with one or more of the domains, wherein said group-able correlation table is used for determining which ones of said contact interfaces are allowed to be processed in parallel;
   performing, in the computer system, a time-marching simulation of the impact event having a plurality of solution cycles;
   at each of the solution cycles,
   creating and sending a first data communication message from the first processing unit to the second processing unit, wherein the first data communication message contains data that are allowed to be grouped together to be processed in parallel according to the group-able correlation table;
   performing a plurality of computations for the respective contact interfaces of the finite element analysis at each of the first and second processing units with data received in the first data communication message;
   creating and sending a second data communication message in a reverse direction of the first data communication message, the second message is configured to transmit data resulted from the computations; and
   displaying results of the simulation on a monitor coupled to the computer system after all of the solution cycles have been computed.

2. The method of claim 1, wherein each of the one or more structures comprises an automobile.

3. The method of claim 1, wherein the impact event comprises a car collision.

4. The method of claim 1, wherein the computer system contains at least two processing units.

5. The method of claim 1, wherein the computer system comprises at least one computer, each having more than one central processor.

6. The method of claim 1, wherein the computer system contains more than one computer, each having at least one central processor.

7. The method of claim 6, wherein the central processor contains at least one processing core.

8. A non-transitory computer usable storage medium containing instructions for controlling a computer system to perform an impact event simulation in a finite element analysis used for assisting users to design or improve one or more structures by a method comprising:
   receiving a finite element analysis model of one or more structures subject to an impact event in the computer system with a plurality of processing units coupled thereon, wherein the finite element analysis model contains a plurality of contact interfaces;
   dividing a finite element analysis model into a plurality of domains containing at least a first domain and a second domain in the computer system, the first domain is associated with a first processing unit while the second domain is associated with a second processing unit of the processing units;
   determining, in the computer system, a group-able correlation table that correlates each of the contact interfaces, with one or more of the domains, wherein said group-able correlation table is used for determining which ones of said contact interfaces are allowed to be processed in parallel;
   performing, in the computer system, a time-marching simulation of the impact event having a plurality of solution cycles;
   at each of the solution cycles,
   creating and sending a first data communication message from the first processing unit to the second processing unit, wherein the first data communication message contains data that are allowed to be grouped together to be processed in parallel according to the group-able correlation table;
   performing a plurality of computations for the respective contact interfaces of the finite element analysis at each of the first and second processing units with data received in the first data communication message;
   creating and sending a second data communication message in a reverse direction of the first data communication message, the second message is configured to transmit data resulted from the computations; and
   displaying results of the simulation on a monitor coupled to the computer system after all of the solution cycles have been computed.

9. A system for simulating an impact event in a finite element analysis used for assisting users to design or improve one or more structures, the system comprising:
   a main memory for storing computer readable code for a finite element analysis application module;
   a plurality of processing units coupled to the main memory, said processing units executing the computer readable code in the main memory to cause the finite element analysis application module to perform operations by a method of:
   receiving a finite element analysis model of one or more structures subject to an impact event, wherein the finite element analysis model contains a plurality of contact interfaces;

dividing a finite element analysis model into a plurality of domains containing at least a first domain and a second domain, the first domain is associated with a first processing unit while the second domain is associated with a second processing unit of the processing units;
determining a group-able correlation table that correlates each of the contact interfaces, with one or more of the domains, wherein said group-able correlation table is used for determining which ones of said contact interfaces are allowed to be processed in parallel;
performing a time-marching simulation of the impact event having a plurality of solution cycles;
at each of the solution cycles,
creating and sending a first data communication message from the first processing unit to the second processing unit, wherein the first data communication message contains data that are allowed to be grouped together to be processed in parallel according to the group-able correlation table;
performing a plurality of computations for the respective contact interfaces of the finite element analysis at each of the first and second processing units with data received in the first data communication message;
creating and sending a second data communication message in a reverse direction of the first data communication message, the second message is configured to transmit data resulted from the computations; and
displaying results of the simulation on a monitor coupled to the system after all of the solution cycles have been computed.

10. The system of claim 9, wherein the computer system contains at least two processing units.

11. The system of claim 9, wherein the computer system comprises at least one computer, each having more than one central processor.

12. The system of claim 9, wherein the computer system contains more than one computer, each having at least one central processor.

13. The system of claim 12, wherein the central processor contains at least one processing core.

\* \* \* \* \*